(12) United States Patent
Santos et al.

(10) Patent No.: US 9,057,001 B2
(45) Date of Patent: Jun. 16, 2015

(54) TRANSPARENT NON-STICK COATING COMPOSITION, METHOD AND APPARATUS

(71) Applicant: Rockwell Automation Technologies, Inc., Mayfield Heights, OH (US)

(72) Inventors: Roberto S. Santos, Hudson, MA (US); Rahul Ganguli, Oak Park, CA (US); Young Chung, Calabasas, CA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 13/667,751

(22) Filed: Nov. 2, 2012

(65) Prior Publication Data

US 2014/0127486 A1 May 8, 2014

(51) Int. Cl.
| | | |
|---|---|---|
| *C09D 127/18* | (2006.01) | |
| *C09D 5/16* | (2006.01) | |
| *C09D 179/08* | (2006.01) | |
| *C08L 33/14* | (2006.01) | |
| *C08L 79/08* | (2006.01) | |
| *G01D 11/26* | (2006.01) | |
| *B23K 35/22* | (2006.01) | |
| *B23K 35/365* | (2006.01) | |

(52) U.S. Cl.
CPC ....... *C09D 127/18* (2013.01); *Y10T 428/24942* (2015.01); *Y10T 428/2495* (2015.01); *B23K 35/22* (2013.01); *C09D 5/1693* (2013.01); *C09D 179/08* (2013.01); *C08L 33/14* (2013.01); *C08L 79/08* (2013.01); *C08L 2666/14* (2013.01); *G01D 11/26* (2013.01); *B23K 35/365* (2013.01)

(58) Field of Classification Search
None
See application file for complete search history.

(56) References Cited

U.S. PATENT DOCUMENTS

| | | |
|---|---|---|
| 3,134,870 A | 5/1964 | Reed et al. |
| 3,243,571 A | 3/1966 | Schmerling |
| 3,371,272 A | 2/1968 | Stanton |
| 3,532,556 A | 10/1970 | Steele |
| 4,123,707 A | 10/1978 | Fujii et al. |
| 4,206,391 A | 6/1980 | Varacins |
| 4,316,145 A | 2/1982 | Tann |
| 4,532,403 A | 7/1985 | Jordan et al. |
| 4,546,141 A | 10/1985 | Gebauer |

(Continued)

FOREIGN PATENT DOCUMENTS

EP  1514910 A1  3/2005

OTHER PUBLICATIONS

[NPL#1] MakeItFrom.com, "Polyamide-Imide (PAI, Torlon)". Copyright 2009-13. <http://www.makeitfrom.com/material-data/?for=Polyamide-Imide-PAI-Torlon>.*

(Continued)

*Primary Examiner* — David Sample
*Assistant Examiner* — Donald M Flores, Jr.
(74) *Attorney, Agent, or Firm* — Boyle Fredrickson, S.C.

(57) ABSTRACT

A coating and method of making, using, and applying the coating to protect structures from scratches and/or the undesired collection of slag and/or spatter associated with metal working processes. The coating includes a base layer and a top layer that, when applied, mitigate adhesion of weld slag to the underlying structure. The coating is also transparent such that it does not interfere with the functionality of any indicia associated with the underlying structure or device and also renders the coating suitable for use with photo-reactive or responsive sensors and/or other non-opaque structures—such as goggles, facemasks, and/or shields.

18 Claims, 3 Drawing Sheets

(56) References Cited

U.S. PATENT DOCUMENTS

| | | | |
|---|---|---|---|
| 4,571,479 | A | 2/1986 | Maeda et al. |
| 4,588,870 | A * | 5/1986 | Nadkarni et al. ............. 219/119 |
| 4,839,244 | A | 6/1989 | Tsukamoto |
| 4,861,392 | A | 8/1989 | Grabe |
| 4,875,009 | A | 10/1989 | Leveque |
| 4,947,024 | A | 8/1990 | Anderson |
| 4,996,408 | A | 2/1991 | Turck et al. |
| 5,000,979 | A | 3/1991 | Cueman |
| 5,542,378 | A | 8/1996 | Kubiak et al. |
| 5,659,290 | A | 8/1997 | Haeri |
| 5,789,920 | A | 8/1998 | Gass |
| 5,844,501 | A | 12/1998 | El-Ibiary |
| 5,912,556 | A | 6/1999 | Frazee et al. |
| 5,952,822 | A | 9/1999 | Kayserman et al. |
| 6,025,562 | A | 2/2000 | Shimizu et al. |
| 6,060,678 | A | 5/2000 | Allford |
| 6,062,796 | A | 5/2000 | Alexander |
| 6,156,995 | A | 12/2000 | Severance, Jr. |
| 6,617,845 | B1 | 9/2003 | Shafiyan-Rad et al. |
| 6,737,580 | B2 | 5/2004 | Eaton et al. |
| 6,811,821 | B2 | 11/2004 | Maxwell et al. |
| 7,968,640 | B2 | 6/2011 | Ganguli et al. |
| 8,202,930 | B2 | 6/2012 | Ganguli et al. |
| 8,207,257 | B2 | 6/2012 | Ganguli et al. |
| 2003/0044619 | A1 * | 3/2003 | Leech et al. ................. 428/421 |
| 2003/0123242 | A1 | 7/2003 | Eaton et al. |
| 2004/0082701 | A1 * | 4/2004 | Ota et al. ...................... 524/474 |
| 2006/0023356 | A1 * | 2/2006 | Banal ........................... 360/133 |
| 2007/0066737 | A1 | 3/2007 | Gallucci et al. |
| 2009/0238614 | A1 * | 9/2009 | Kakyo .......................... 399/302 |
| 2010/0327855 | A1 | 12/2010 | Ganguli et al. |
| 2011/0215027 | A1 * | 9/2011 | Ganguli et al. ............... 206/701 |
| 2011/0287239 | A1 | 11/2011 | Nardi et al. |
| 2012/0034448 | A1 * | 2/2012 | Liu ............................... 428/325 |
| 2012/0199994 | A1 * | 8/2012 | Richert et al. ............... 264/1.35 |

OTHER PUBLICATIONS

[NPL#2] MakeItFrom.com, "Polyphenylene Sulfide (PPS)". Copyright 2009-13. <http://www.makeitfrom.com/material-data/?for=Polyphenylene-Sulfide-PPS>.*

[NPL#4] Keijman, J. M., "The evolution of siloxane epoxy coatings in the protetive coatings industry". Ameron International, (Feb. 27, 2012—"TheWayBackMachine"), <http://ppgamercoatus.ppgpmc.com/techcenter/docs/Evolutionofsiloxaneepoxycoatings.pdf>.*

Rockwell Automation, Inc., Product Profile VersaCube (TM) with Slag-Resistant Coating Offers Enhanced Durability in Harsh Welding Applications, Publication 871P-PP001A-EN-P, Oct. 2003.

Rockwell Automation, Inc., Product Profile 871ZT Tough Weld (TM) 3-Wire DC Inductive Proximity Sensor, Publication 871ZT-PP001A-EN-P, May 2005.

Rockwell Automation, Inc., Sensors Today—Magazine, Publication GSM900-BR001J-EN-P, Feb. 2005.

Turck, Inc., Turck Weldguard Sensors, www.turck.com.

Balluff Inc., Weld Select Series, www.balluff.com/welding.

Balluff Inc., Weld Select Quick-Start Guide, www.balluff.com/welding.

Balluff Inc., Tubular Inductive Sensors, www.balluff.com.

Balluff Inc., Slag Master (TM) Slag Resistant Coating, www.balluff.com/SlagMaster.

IFM Efector, Robust Metal Face Sensors for Welding and Stamping Applications.

Pepperl+Fuchs, Weld Immune Proximity Sensors, www.am.pepperl-fuchs.com.

Pepperl+Fuchs, Special Proximity Sensors, www.am.pepper-fuchs.com.

Halliday, David and Resnick Robert, Physics, Parts I and II, Third Edition; p. 481, Table 22-2; New York: John Wiley & Sons (1978).

Partial European Search Report Application No. 13191402.0; dated Mar. 3, 2014—(6) pages.

Extended European Search Report Application No. 13191402.0: dated Jun. 13, 2014—(11) pages.

* cited by examiner

TRANSPARENT NON-STICK COATING COMPOSITION, METHOD AND APPARATUS

FIELD OF THE INVENTION

The invention relates to non-stick coatings. More particularly, the invention relates to transparent non-stick coatings that can be applied to sensors or other structures used in high heat environments such as welding applications where the sensors or structures can be exposed to weld slag whose accumulation can cause premature failure of the sensors. The preferred embodiments of the present invention are directed toward a non-stick coating that prevents the buildup of slag and is optically transparent, thereby increasing the longevity and functionality of the underlying device as well as increasing the applicability of the coating.

BACKGROUND OF THE INVENTION

Use of non-stick coatings is well known in the art. The prior art discloses a myriad of non-stick coatings and applications for such coatings. The composition of non-stick coatings varies and each variation brings different considerations, many of which are not particularly useful in the field of welding applications. As discussed below, innovations for improved non-stick coatings are driven by considerations related to developing coatings that can be conveniently applied, do not otherwise interfere with the operability or functionality of the underlying device or structure, include environmental considerations, and/or are more effective at prolonging the operating life of underlying devices through an increased resistance to degradation of the coating due to exposure to harsh operating environments—such as welding or metal working environments.

One exemplary device commonly exposed to a welding environment are proximity or location sensors associated with confirming the location of parts intended to be welded together. Such sensors are frequently electromagnetic in nature and multiple such sensors are commonly employed in various industries such as in automobile assembly lines to detect the position of parts during welding operations that are commonly conducted by robotic welders. Such sensors are often positioned in close proximity to the welding operation such that the sensors can be directly exposed to a spatter of hot material and/or slag associated with such metal working processes. Unless the slag falls off the sensor, the slag accumulates on the sensor and, if left unaddressed, can render the sensor inoperative. Most assembly lines include multiple such proximity sensors and the downtime that results from the delay needed to replace any of the sensors increases per unit production costs from both the delay of production operations as well as the time and personnel investment associated with the physical repair and/or replacement of inoperable sensors.

In assessing the ability of a surface to withstand such an interaction, various parameters of the surface are assessed. Erosion wear due to impinging particles on a target material surface can be modeled as:

$$V = \frac{dE^{\frac{5}{4}}}{H^{\frac{17}{12}}K_{IC}};$$

where V is the volume of the target surface eroded, d is the density of the material, E is the modulus of elasticity or elastic modulus, H is the material hardness, and $K_{IC}$ is the fracture toughness of the target or afflicted surface. In the case of proximity sensor operation, greater erosion wear of the sensor face leads to increases in the density or concentration of pits and craters formed in the sensor face. Such pits or craters provide surface discontinuities that expedite the accumulation of weld slag or spatter on the sensor. The exposed sensor can fail if the slag accumulated on a particular sensor exceeds a threshold value and such sensors commonly fail to a part present signal. That is, the sensor can be said to be locked-on in that the buildup of metallic slag on the sensor is improperly interpreted by the sensor as a part always being present at a desired location.

In resolving the surface degradation discussed above, surface hardness has been shown to have a greater effect on reducing erosion wear than the fracture toughness of the afflicted material. Increasing the hardness value associated with a surface or coating has been a popular approach to mitigate weld slag accumulation. Unfortunately, such an approach provides only limited benefit in mitigating undesired slag accumulation.

In addition to mitigating surface degradation, it is also known that the force of stiction, or the frictional force that must be overcome to allow motion between stationary contacting objects—such as slag already undesirably adhered to a sensor or structure, can be manipulated by different surface materials or treatments. Stiction is related to the elastic modulus and surface energy of a material and can be modeled as:

$$F = \frac{\gamma}{E};$$

where γ is surface energy and E is the elastic modulus. Therefore, reducing the value of the surface energy will reduce the value of the stiction force associated with the surface and thereby reduce the ability of slag to collect on the particular surface.

Fluoropolymer based coatings, such as polytetrafluoroethylene (or PTFE) coatings—such as Teflon® (a registered trademark of DuPont), can be used to reduce the weld slag adhesion performance of exposed sensors, as they have low surface energy. However, low surface energy polymers such as PTFE do not have high hardness and, over time, weld slag particles abrade the PTFE coating such that discontinuities or pits develop in the exposed surface of the coating. The pitting or surface porosity provides the initial surface discontinuity that promotes weld slag adhesion. Over time, weld slag accumulates on the sensor thereby degrading operability of the sensor and ultimately, if left unaddressed, renders the sensor inoperable so as to require replacement of the sensor to maintain process operations.

Various approaches have been undertaken to reduce the detrimental effects of slag collection on such sensors. U.S. Pat. No. 4,996,408 by Turck, et al., entitled "Proximity switch for use in welding facilities," discloses a polytetrafluoroethylene (or PTFE) with perfluoroalkoxy side chains based nonstick coating that can be applied to proximity switches. The reference discloses mixing coloring pigments with the PTFE material however the coloring pigments do not otherwise manipulate the anti-adhesion properties of the coating. Many such currently available coatings also tend to be non-aqueous based such that, manufacturing and use of such coating materials tends to be expensive as such manufactures must also satisfy various volatile organic carbon (VOC) emission manufacturing standards.

Still others have attempted to manipulate the slag adhesion of fluoropolymer coatings through the use of fillers to increase the hardness and reduce the surface energy of the fluoropolymers. U.S. Pat. Nos. 7,968,640; 8,202,930; and 8,207,257 to Ganguli et. al. describe various composite coatings with acidified graphite and fluoropolymers that provide improved nonstick performance over other asserted nonstick coatings. The acidified graphite increases hardness while retaining comparatively low surface energy. Additionally, the graphite increases the thermal conductivity of the coating thereby reducing local heat generation and surface pitting attributable to thermal decomposition of the polymer of the coating.

Other solutions to the problem of undesired weld slag adhesion and collection include alternate construction materials and/or specialized protective accessories. U.S. Pat. No. 6,617,845 to Shafiyan-Rad, et al., entitled "Proximity sensor resistant to environmental effects," discloses a housing configured to encase a sensor. The housing is disclosed as being made of a material with high thermal conductivity, such as copper or an alloy thereof. Such a device uses the inherent properties of the material of a housing extraneous to the sensor to disperse the heat associated with slag adhesion but does not provide a coating that can be economically applied to other structures or devices intended to be protected.

Each of the methodologies discussed above provide coatings or shield structures that are intended to protect an underlying structure but each of the methodologies discussed above also provide only opaque structures or coatings. When such coating methodologies are used, application of an opaque coating, while improving the slag adhesion performance, negates the use of any markings and/or indicators such as LED's that may be supported by the underlying structure, such as a proximity sensor. The opaque nature of such coatings also limits the types of sensors that can be coated and prevents use of the coating on other transparent weld accessories, such as inspection shields, goggles, and/or facemasks.

Therefore, there is a need for a coating that provides improved anti-stick weld slag performance and which protects the longevity associated with the underlying device. There is also a need for a coating that does not interfere with inspection of indicia associated with the underlying device and/or which is applicable or usable on other non-opaque devices or structures that may be exposed to the welding environment.

SUMMARY OF THE INVENTION

The present invention discloses a coating that overcomes one or more of the drawbacks discussed above. One aspect of the invention discloses a coating and method of making, using, and applying the coating to protect structures from scratches and/or the undesired collection of slag and/or spatter associated with metal working processes. The coating includes a base layer and a top layer that, when applied, mitigate adhesion of weld slag to the underlying structure. The coating is also transparent such that it does not interfere with the functionality of any indicia associated with the underlying structure or device and also renders the coating suitable for use with photo-reactive or responsive sensors and/or other non-opaque structures—such as goggles, facemasks, and/or shields.

Another aspect of the invention that is useable with one or more of the above aspects discloses a coating for resisting adhesion of high temperature material spatter. The coating includes a base coat that is formed by a mixture of a first elastic modulus polymer material and a second elastic modulus polymer material. A top coat that is formed of a fluoropolymer material having a surface energy that is lower than a surface energy of the base coat is applied to the base coat. Such a coating is transparent and mitigates the collection of weld slag on coated structures.

Another aspect of the invention that is usable with one or more of the features or aspects above discloses a sensor device having a housing that is shaped to enclose a sensing component. A coating for mitigating adhesion of material to the housing is applied to at least a portion of an exterior surface of housing. The coating includes a first layer and a second layer that overlays the first layer. The first and second layers are further defined by wherein the first layer has a higher hardness than the second layer and the second layer has a lower surface energy than the first layer.

Another aspect of the invention discloses a method of protecting a surface from hot weld slag that is useable and/or combinable with one or more of the above features and aspects. The method includes applying a base coat layer that has an intermediate elastic modulus to a surface and then applying a top coat layer that has a lower surface energy than the base coat layer over the base coat layer. The two layer coating resists weld slag adhesion better than known coatings and is also transparent thereby increasing the applicability and/or usability of the coating.

In a preferred aspect, the coating is comprised of a base coat of an intermediate elastic modulus and a topcoat of low surface energy. The coating is preferably not opaque and is more preferably transparent to allow use of the coating on structures that are not commonly and/or cannot be opaque. It is further preferred, and important for certain applications, that the thickness of the top coat be less than the size of weld particles for which the coating is expected to be subjected when the coating is used in metal working environments.

The foregoing and other aspects, objects, and/or features of the present invention are intended to be illustrative of the invention and are not meant in a limiting sense. Many possible embodiments of the invention may be made and will be readily evident upon a study of the following detailed description and the accompanying drawings. Various features and subcombinations of the invention may be employed without reference to other features and subcombinations. Other objects, aspects, features, and/or advantages of this invention will become apparent from the following description.

BRIEF DESCRIPTION OF THE DRAWINGS

Preferred embodiments of the invention, illustrative of the best modes in which the applicant has contemplated applying the principles, are set forth in the following description and are shown in the drawings and wherein.

The following detailed description relates to the preferred embodiments of the present invention. It is to be understood that the disclosed embodiments are merely exemplary of the invention, which may be embodied in various forms. Therefore, specific structural and functional details disclosed herein are not to be intended to or to be interpreted as limiting the scope of the present invention, but rather provide the necessary support for the claims as presented herein and are a representative basis for teaching one skilled in the art to variously employ the present invention in virtually any appropriately detailed structure, field, or application.

DESCRIPTION OF THE PREFERRED EMBODIMENTS

Figure 1:
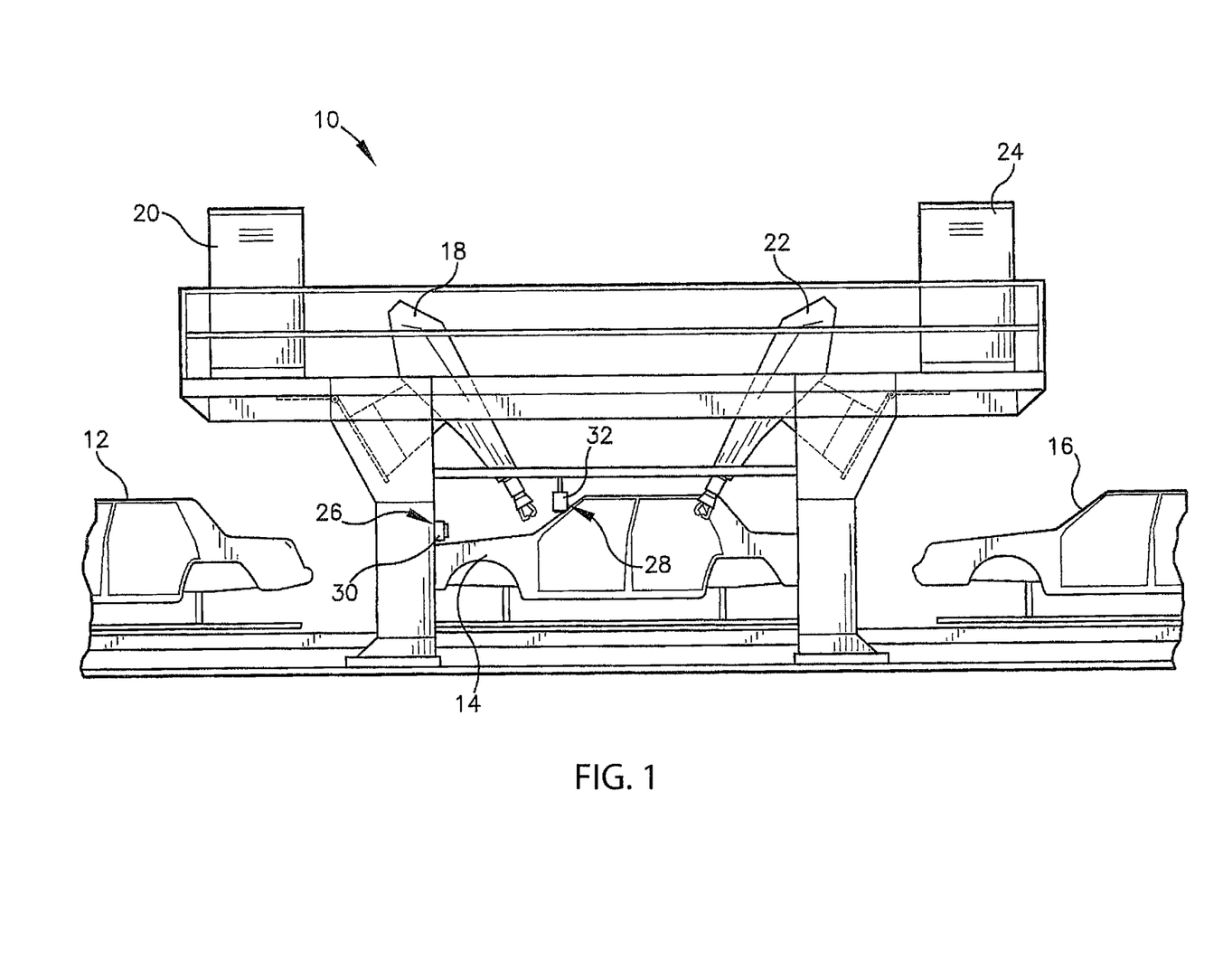
FIG. 1 is side elevation view of a segment of an automated welding line showing a sensor according to the present invention in position adjacent welding devices to register the position of the work pieces on the welding line.

FIG. 1 shows an exemplary operational environment equipped with at least one sensor or other structure that is commonly positioned proximate a welding environment and has a coating according to the present invention. Those skilled in the art should appreciate that that which is shown in FIG. 1 as only a portion of an assembly or welding line 10 associated with an at least partly automated production of automobiles. It is appreciated that the present invention has applicability beyond the environment shown in FIG. 1.

As shown in FIG. 1, a number of work pieces 12, 14, 16 that are intended to be welded together, whether to form an automobile or other structure, are moved along welding line 10. As the work pieces 12, 14, 16 advance along welding line 10, the work pieces are detected by one or more location, orientation, or proximity sensors 26, 28 as the work pieces 12, 14, 16 enter an operating range associated with the respective sensors 26, 28. Sensors 26, 28 are commonly provided as electromagnetic-type sensors that detect the presence of the work pieces 12, 14, 16 based on the metallic material of the work pieces. As alluded to above, the coating of the present invention, and particularly the non-opaque and more preferably transparent nature of the coating, allows other types of sensors, such as photo-electric, photo-voltaic, or other photo or light responsive sensors to be utilized in close proximity to welding operations and in a manner and with sensor longevities that have heretofore been unavailable due to the opaque nature of previous available coatings and/or weld slag collection abatement methodologies.

Regardless of the type or operational methodology of sensors 26, 28, whether the same or different, sensors 26, 28 detect the desired location and/or orientation of one or more work pieces 12, 14, 16 for subsequent processing of a work pieces 12, 14, 16. It will be appreciated by those skilled in the art how welding line 10 generally operates when provided with location or proximity sensors 26, 28 for detecting the position of the work pieces 12, 14, 16 along the welding line 10 and that pieces 12, 14, 16 are commonly welded by robotic welders 18, 22 that are preferably operated by one or more welding controllers 20, 24. Sensors 26, 28 are maintained in operational proximity to work pieces 12, 14, 16 and robotic welders 18, 22 such that sensors 26, 28 are commonly subjected to the hot metal slag and/or hot metal spatter associated with the welding operation.

As the work pieces 12, 14, 16 approach sensors 26, 28, electromagnetic proximity sensors detect the presence of the work pieces 12, 14, 16 and transmit data to welding controllers 20, 24. Welding controllers 20, 24 adjust the advancement of welding line 10 to permit welding devices 18, 22 to be moved into position to generate a weld at a predetermined position on work pieces 12, 14, 16. It will be appreciated that sensors 26, 28 are often near enough to the operation of welding devices 18, 22 that either and/or both of the sensors 26, 28 and/or housings 30, 32 associated therewith may be exposed to hot weld slag or weld bi-product that is splattered in the direction of the sensors 26, 28 from the weld site during operation of welding devices 18, 22.

As explained further below with respect to FIG. 3, a coating according to the present invention is applied to one or more of sensors 26, 28, and/or housings 30, 32 and protects the sensors/housings from the detrimental effects associated with excessive build up of weld slag. As also explained further below with respect to FIG. 3, the coating according to the present invention allows the structure that is coated to better mitigate the detrimental effects of weld slag built-up and/or concentration and allows the coated structures to better resist surface degradation associated with any incidental contact with weld slag and/or spatter.

Figure 2:
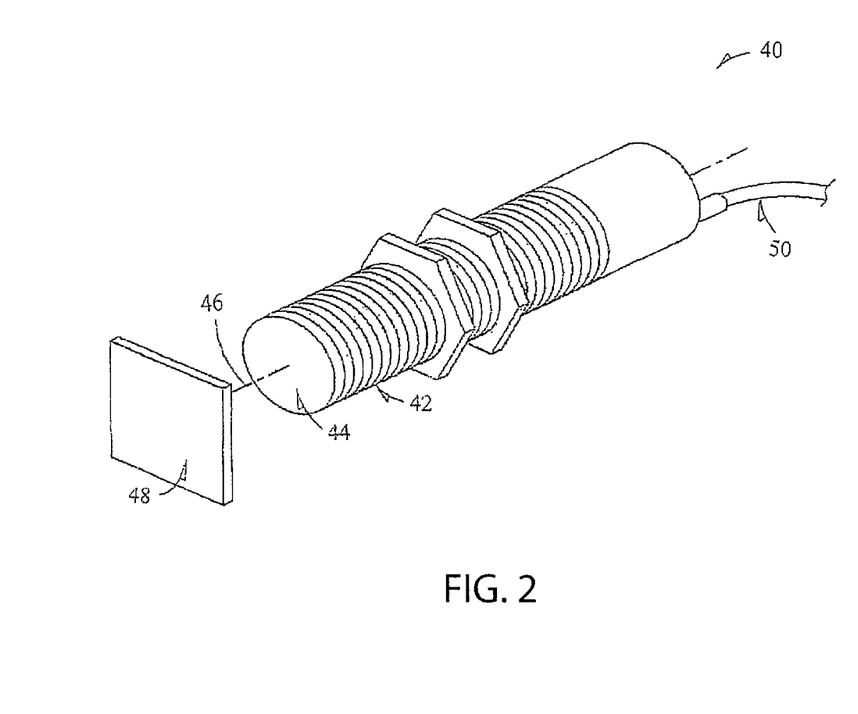
FIG. 2 is a perspective view of an industrial control, such as an inductive proximity sensor, configured according to another embodiment of the invention.

FIG. 2 shows another example of an industrial control, such as a proximity sensor 40 for sensing one or more objects 48 that can also be coated with any of the various surface coating compositions disclosed below. Proximity sensor 40 has an elongate cylindrical housing 42 although it is appreciated that housing 42 can have virtually any shape. For instance, housing 42 can have a rectangular prism shape, cube shape, or other shapes. The housing 42 is partly defined by a longitudinal axis 46. A sensing face 44 is located at one end of the housing 42 to permit the associated circuitry or sensing components located within the housing 42 to perform a proximity sensing function through sensing face 44. Sensing face 44 may be formed as an integral part of housing 42 or may be a separate piece which is then attached to the housing 42 as is known in the art. Sensing face 44 may be made of a metal, thermosetting plastic or resin material, or other material known in the art.

A connection means 50, such as a cable, plug, receptacle, or other connection means as are known in the art, is located opposite sensing face 44. In accordance with a preferred embodiment of the present invention, external surfaces of one or more of housing 42 and sensing face 44 are coated with a transparent non-stick material or coating that resists surface degradation and permits weld slag to fall off of sensor 40 before the slag can adhere to either the coating or the structures of sensor 40, housing 42, and/or sensor face 44. Since the coating is transparent, any LED's, markings, or other visual indicia associated with sensor 40 are visible through the coating. Such functionality allows application of the coating after assembly of the sensor has been completed. The coating also does not interfere with any indicia that may have been applied and/or are operable with the sensor, such an indicator LED's, product identification, operational rating markings, etc. Accordingly, the coating does not detract from functionality provided by sensor 40.

Figure 3:
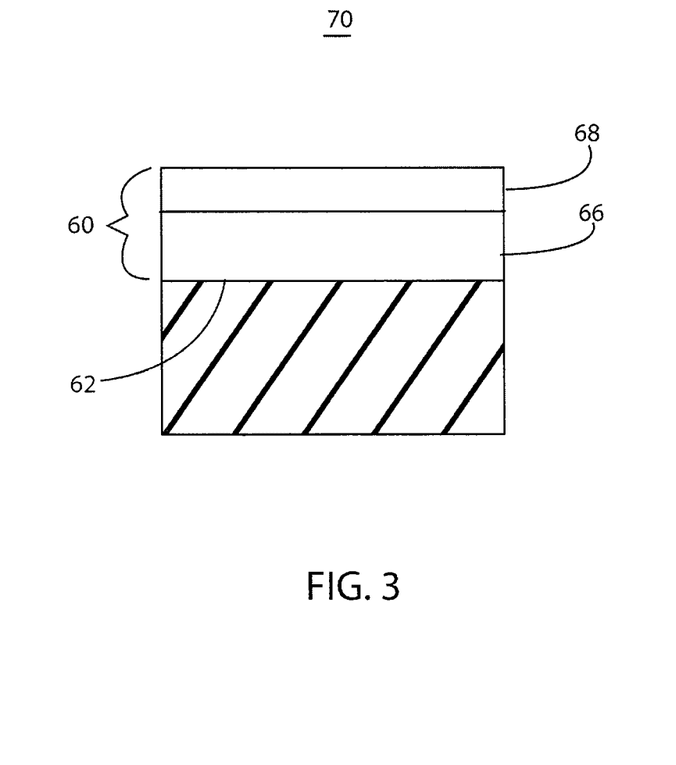
FIG. 3 is a cross-sectional view of the two layer coating applied to a structure according to the present invention.

FIG. 3 is a cross-section view of a two-layer coating 60 according to the present invention. As alluded to above, it is appreciated that coating 60 can be applied to a structure or surface 62 that forms one or more of sensors 26, 28, 40, housings 30, 32, 42, and/or sensing face 44. It is further appreciated that surface 62 could be provided as a non-opaque material or structure or even transparent structures such as lens covers, a thee mask, lens, goggles and/or other structures where scratch resistance and/or degradation caused by exposure of weld slag and/or spatter is hoped to be avoided. It is appreciated that, regardless of the intended function of the underlying device associate with surface 62, surface 62 can be made of a metal, thermoplastic, thermoset plastic, other materials, and/or combinations thereof. Regardless of the nature of surface 62, coating 60 is preferably transparent so as to allow visual inspection of, or through, surface 62.

As shown in FIG. 3, coating 60 includes a first layer or base coat 66 that underlies a second layer or top coat 68. Said in another way, top coat 68 is exposed to atmosphere 70, which may include weld slag or hot metal spatter as the situation may require, and whereas base coat 66 is disposed between top coat 68 and surface 62. As disclosed below, it is appreciated that base coat 66 and top coat 68 can be provided as a number of materials and/or mixtures of materials. Coating 60 enables surface 62 to dissipate the heat associated with weld slag and provides a smooth and hard surface that allows surface 62 and coating 60 to shed weld slag in an improved manner. As described above, coating 60 is also preferably not opaque and is preferably transparent thereby allowing visual inspection of surface 62.

In a preferred embodiment, base coat 66 comprises a mixture of a UV curable epoxysiloxane material that is mixed with a softer, high temperature resistant polyimide such that the mixture provides a material having an intermediate elastic modulus relative to the scale of elastic modulus. In other embodiments, base coat 66 can be formed with a composition of an epoxysiloxane-polyimide combination and in still other embodiments base coat 66 can be formed as an epoxy-mercapto ester combination. The base coat can alternatively be a mixture of UV curable epoxy mixed with a softer acrylate to reduce the elastic modulus. Regardless of the composition of base coat 66, in one embodiment, top coat 68 can be a micronized polytetrafluoroethylene. The modified hard coat or base coat 66 is applied to the sensing face substrate or surface 62 followed by the application of a fluoropolymer top coat 68 that is applied onto the modified base coat. It is appreciated that coating 60 can be applied to any structure including those exposed to welding process by-products such as weld slag and spatter.

When used in a metal working environment, the thickness of top coat 68 is preferably less than the size of anticipated weld slag particles to which the coating is expected to be subjected. Other embodiments can include adding a nanometer sized hardening agent to base coat 66, such as refractory oxides, carbides and nitrides of aluminum, zirconium, boron, silicon, tungsten, molybdenum, etc. The size scale of the hardening agent is preferably less than approximately 50 nm to preserve the desired degree of transparency of coating 60 although other hardening agent sizes can be tolerated if transparency is not desired or required of the resultant coating. Alternatively, the hardening agent can be index matched to the base coat to preserve transparency, even though the particle size may be substantially greater than 50 nm.

Base coat 66 is preferably applied to the entire housing or structure of a sensor or other structure associated with surface 62. As discussed further below, base coat 66 can be applied in a variety of ways including painting, spraying, and dipping. It is appreciated that base coat 66 can be UV or thermally cured. After base coat 66 is cured, top coat 68 is applied thereover and thermally cured. The thermal cure temperatures of coats 66, 68 range from ambient to about 60° C.

As explained further below, test data shows that compositions of base coat 66 and top coat 68 as disclosed above, when applied to a proximity sensor, provides up to a two-fold improvement in weld slag resistance over other currently available proximity sensors treated with other weld slag antistick coatings. Accordingly, coating 60 provides a sensor service life for similar environments that is longer than the current state of the art. Additionally, the transparency of coating 60 enables a single sensor construction and fabrication methodology that does not require post coating alterations to enable or re-enable functionality inherent to the sensor—such as sensor labels and/or operational indicators such as LED's.

Various two-part coatings were examined while investigating means for improving weld slag anti-stick methodologies and coatings. During these efforts it was noted that various specific chemicals provided by specific manufacturers were used but it is appreciated that the generic equivalents or simple substitutions from other manufactures are considered to be suitable replacements.

One coating solution preparation included use of:
NOA 68(N68): Norland Optical Adhesive 68;
Polyimide(PI): DuPont Parylin PI4700;
Zipcone UE(Z): epoxycyclohexyl modified silicone;
Ethyl L-lactate (EL);
CeO2: 20 wt. % Nano-CeO2 particle dispersed in water; and
AquaFlon DF: 37.5 wt. % sub-micron PTFE particles dispersed in water.

A primer solution was prepared by mixing NOA 68 (6 g), Polyimide (4 g) and Ethyl L-lactate (190 g). A base coat solution was prepared by mixing Zipcone UE (90 g), Polyimide (10 g) and Ethyl L-lactate (153.1 g). A wetting solution was prepared by mixing nanoparticles of CeO2 (2 g) and methanol (98 g). A top coat solution was prepared by mixing AquaFlon DF (10 g) and water (90 g). Fabrication of coating 60, regardless of the substrate associated with surface 62 was provided in two steps: (a) coating solution preparation and (b) coating deposition.

During coating deposition, the primer was deposited using spray or dip coating and cured using UV cure in an inert atmosphere (nitrogen). The base coat was deposited using spray or dip coating and cured using UV cure in an inert atmosphere (nitrogen). After base coat curing, a wetting layer was deposited over the base coat using spray or dip coating and dried for ten minutes at 80° Celsius. The final top coat was deposited by spray or dip coating and allowed to dry for 10 minutes at 80° Celsius.

Proximity sensors with the two layer coating described above were tested simultaneously with identical, commercially available proximity sensors with a weld slag coating. Both sensors were tested in a weld flash generating apparatus at an independent testing laboratory. The sensor with the coating described by this invention lasted, on average, twice as long as commercially available proximity sensors treated with another commercially accepted weld slag coating. The coating described above was also shown to be transparent thereby evidencing the applicability of the coating for use on other non-opaque structures and as negating any post coating treatment of the sensor to maintain identification information associated with the same.

Another coating solution preparation included use of:
NOA 68(N68): Norland Optical Adhesive 68;
Polyimide(PI): DuPont Parylin PI4700;
Master Bond UV11-3(M): UV curable epoxy;
NOA 63(N63): Norland Optical Adhesive 63;
Ethyl L-lactate(EL);
CeO2: 20 wt. % Nano-CeO2 particle dispersed in water; and
AquaFlon DF: 37.5 wt. % sub-micron PTFE particles dispersed in water.

A primer solution was prepared by mixing NOA 68 (6 g), Polyimide (4 g) and Ethyl L-lactate (190 g). The base coat solution was prepared by mixing Master Bond UV11-3(M) (90 g) and NOA 63 (10 g). A wetting solution was prepared by mixing nanoparticles of CeO2 (2 g) and methanol (98 g). The topcoat solution was prepared by mixing AquaFlon DF (10 g) and water (90 g).

The primer was deposited using spray or dip coating and cured using UV cure in an inert atmosphere (nitrogen). The base coat was deposited using spray or dip coating and cured using UV cure in air. After basecoat curing, a wetting layer was deposited using spray or dip coating and dried for ten minutes at 80° Celsius. The final top coat was deposited by spray or dip coating and dried for ten minutes 80° Celsius.

Proximity sensors with the two layer coating described above were tested simultaneously with identical, commercially available proximity sensors with a weld slag coating. Both sensors were tested in a weld flash generating apparatus at an independent testing laboratory. The sensor with the coating described above lasted on average 10% longer than the commercially available proximity sensor with a weld slag coating. Additionally, the coating described above was also transparent.

In a separate screening experiment, surfaces with either type of base coat (epoxysiloxane/polyimide or epoxy-mercaptoester) were coated with a thick layer of the fluoropolymer (>20 micron in thickness). When exposed to spatter generated by a steel cutting saw, significant weld accumulation was noticed. In contrast very little weld accumulation was noticed when the thickness of the fluorpolymer was less than 1 micron. This demonstrated that the thickness of the topcoat affects the weld slag repelling performance of the respective coatings.

As can be appreciated from the foregoing description, base coat 66 can have widely varying compositions. A composition that includes a high elastic modulus polymer mixed with a smaller amount of softer elastic modulus polymer reduces damage possibly by increasing fracture strength without jeopardizing coating hardness. The fluoropolymer and/or other low surface energy top coat 68 work well for particular applications when the thickness of the softer, low surface energy top coat layer is less than the size of weld particulates anticipated to be impinged upon the coating.

The coating neither maximizes hardness, nor minimizes surface energy as compared to other known weld slag anti-stick coatings. Based on these existing theories, the coating disclosed herein displayed unexpectedly beneficial slag resistance. That is, the variation provided by a coating having greater hardness at depth and a thin low surface energy surface proved surprisingly effective at repelling weld slag.

Coating 60 was also shown to be transparent. Such a feature allows coating 60 to be applied to an entire sensor package and yet allows inspection of any sensor markings, such as laser marking or printing, and LED indicators, etc. The ability to coat the entire sensor, including any LED's mitigates another concern of prior art coatings wherein such LED's could not be coated and thereby created a weak spot in the sensor anti-stick slag coating. The transparency of coating 60 allows the entirety of sensors to be coated thereby preserving the aesthetics of the sensor package by not altering or concealing the color of the underlying substrate and significantly reduces the complexity of the coating as the sensor face and the housing can be coated, at one time, thereby reducing the complexity and cost of the process. The transparent nature of coating 60 allows use of the coating on other types of sensors, such as photoelectric or other photo-sensitive or reactive sensors, that are not typically used in welding applications as the optics would be quickly rendered inoperable with only minimal slag accumulation. The transparency of coating 60 also allows the coating to be applied to face shields, goggles, lens, welding helmets, or structures that are intended to be see-through and which may be exposed to the by-products associated with the welding environment. It is appreciated that coating 60 has applicability beyond the limited list provided herein.

In the foregoing description, certain terms have been used for brevity, clearness and understanding; but no unnecessary limitations are to be implied therefrom beyond the requirements of the prior art, because such terms are used for descriptive purposes and are intended to be broadly construed. Moreover, the description and illustration of the invention is by way of example, and the scope of the invention is not limited to the exact details shown or described.

Certain changes may be made in embodying the above invention, and in the construction thereof, without departing from the spirit and scope of the invention. It is intended that all matter contained in the above description, and shown in the accompanying drawings, shall be interpreted as illustrative and not meant in a limiting sense. Having now described the features, discoveries and principles of the invention, the manner in which the inventive composition and method is to be constructed and used, the characteristics of the construction, and advantageous, new and useful results obtained; the new and useful structures, devices, elements, arrangements, parts and combinations, are set forth in the appended claims. It is also to be understood that the following claims are intended to cover all of the generic and specific features of the invention herein described, and all statements of the scope of the invention which, as a matter of language, might be said to fall therebetween.

What we claim is:

1. A coating for resisting adhesion of high temperature material spatter, the coating comprising:
   a base coat formed by a mixture of a first polymer material having an elastic modulus and a second polymer material having an elastic modulus that is less than the elastic modulus of the first polymer material, the base coat having a first side engaged with a surface that is to be protected from high temperature material spatter; and
   a top coat that overlies a second side of the base coat such that the top coat is exposed to high temperature material spatter, the top coat being formed of a fluoropolymer material having a surface energy that is lower than a surface energy of the base coat and the coating is not opaque.

2. The coating of claim 1 wherein the elastic modulus of the first polymer material is defined as a high elastic modulus relative to an elastic modulus scale and the elastic modulus of the second polymer is defined as a low elastic modulus relative to the elastic modulus scale and the mixture includes a larger amount of the first polymer material than the second polymer material.

3. The coating of claim 1 wherein the base coat is thicker than the top coat.

4. The coating of claim 3 wherein a thickness of the top coat is less than 1 micron.

5. The coating of claim 1 wherein the mixture of the base coat is further defined as one of an epoxysiloxane and a polyimide combination or an epoxy-mercapto ester combination.

6. The coating of claim 1 wherein the coating is transparent.

7. The coating of claim 1 applied to at least one of a sensor, a photo-electric sensor, a face shield, goggles, and a transparent structure.

8. A sensor device comprising:
   a housing shaped to enclose a sensing component; and
   a coating for mitigating adhesion of material to the housing, the coating applied to at least a portion of an exterior surface of housing, the coating being transparent and comprising:
      a first layer applied to the exterior surface of the housing;
      a second layer that directly overlays the first layer and is exposed to atmosphere; and
      wherein the first layer has a higher hardness than the second layer and the second layer has a lower surface energy than the first layer.

9. The sensor device of claim 8 wherein the coating is applied to the entirety of the exterior surface of the housing.

10. The sensor device of claim 8 wherein the sensing component is photo-responsive.

11. The sensor device of claim 8 wherein the coating mitigates adhesion of hot welding slag to exterior surface of the housing.

12. The sensor device of claim 8 wherein the second layer has a thickness that is less than 1 micron.

13. The sensor device of claim 8 wherein the first layer of the coating has an intermediate elastic modulus value relative to an elastic modulus scale.

14. A coating for resisting adhesion of spatter associated with metal working activities, the coating comprising:
 a first layer formed by a mixture of a first polymer material having an elastic modulus and a second polymer material having another elastic modulus that is less than the elastic modulus of the first polymer material, the first layer having a first side that directly engages a surface to he protected from spatter associated with metal working activities;
 a second layer that directly overlies a second side of the first layer and is exposed to spatter associated with metal working activities, the second layer being formed of a fluoropolymer material having a surface energy that is lower than a surface energy of the first layer and wherein the first layer and the second layer are transparent.

15. The coating of claim 14 wherein the first layer is thicker than the second layer.

16. The coating of claim 15 wherein the second layer has a thickness that is less than 20 microns.

17. The coating of claim 16 wherein the second layer has a thickness that is less than 1 micron.

18. The coating of claim 14 wherein the surface associated with the first side of the first layer is further defined as one of a sensor, a photo-responsive sensor, a facemask, a helmet, or goggles.

* * * * *